(12) United States Patent
Otake (10) Patent No.: US 7,277,036 B2
(45) Date of Patent: Oct. 2, 2007

(54) DIGITAL-TO-ANALOG CONVERTING CIRCUIT

(75) Inventor: Hideyuki Otake, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 88 days.

(21) Appl. No.: 10/625,902

(22) Filed: Jul. 24, 2003
(Under 37 CFR 1.47)

(65) Prior Publication Data
US 2005/0116852 A1    Jun. 2, 2005

(30) Foreign Application Priority Data
Jul. 24, 2002    (JP) .............................. 2002-215121

(51) Int. Cl.
*H03M 1/78*    (2006.01)
*H03M 1/66*    (2006.01)

(52) U.S. Cl. ...................................... 341/154; 341/144
(58) Field of Classification Search ................ 341/155, 341/120, 154, 144, 145, 159, 156; 330/86
See application file for complete search history.

(56) References Cited

U.S. PATENT DOCUMENTS

| | | | | |
|---|---|---|---|---|
| 4,918,448 A | * | 4/1990 | Hauviller et al. ............ | 341/145 |
| 4,973,979 A | * | 11/1990 | Ikeda ........................ | 341/154 |
| 5,111,205 A | * | 5/1992 | Morlon ...................... | 341/156 |
| 5,523,721 A | * | 6/1996 | Segawa et al. ............... | 330/86 |
| 5,604,501 A | * | 2/1997 | McPartland .................. | 341/144 |
| 5,703,588 A | * | 12/1997 | Rivoir et al. ............... | 341/159 |
| 5,731,775 A | * | 3/1998 | Gross et al. ................. | 341/155 |
| 5,831,566 A | * | 11/1998 | Ginetti ....................... | 341/144 |
| 5,841,382 A | * | 11/1998 | Walden et al. ............... | 341/120 |
| 5,969,657 A | * | 10/1999 | Dempsey et al. ............ | 341/145 |
| 5,999,115 A | * | 12/1999 | Connell et al. .............. | 341/145 |
| 6,157,335 A | * | 12/2000 | Suzuki et al. ................ | 341/154 |
| 6,201,491 B1 | * | 3/2001 | Brunolli et al. ............. | 341/144 |
| 6,400,300 B1 | * | 6/2002 | Leung et al. ................ | 341/154 |
| 6,414,616 B1 | * | 7/2002 | Dempsey .................... | 341/144 |
| 6,441,758 B1 | * | 8/2002 | Koyama et al. ............. | 341/136 |
| 6,914,547 B1 | * | 7/2005 | Swaroop et al. ............. | 341/144 |
| 2001/0033242 A1 | * | 10/2001 | Castaneda et al. .......... | 341/154 |
| 2002/0021235 A1 | * | 2/2002 | Koyama et al. ............. | 341/136 |
| 2003/0043061 A1 | * | 3/2003 | Koyama et al. ............. | 341/144 |

FOREIGN PATENT DOCUMENTS

| | | |
|---|---|---|
| JP | 04132315 | 5/1992 |
| JP | 10004354 | 1/1998 |

* cited by examiner

*Primary Examiner*—Jean Bruner Jeanglaude
(74) *Attorney, Agent, or Firm*—Volentine & Whitt, P.L.L.C.

(57) ABSTRACT

A digital-to-analog converting circuit includes first and second potential terminals, an output node, first and second resistors, first and second switches and a control circuit. The first resistors are connected in series between a first node and the output node through first connecting points. Each of the first switches is connected between the first potential terminal and one of the first connecting points and the first node. The second resistors are connected in series between a second node and the output node through second connecting points. Each of the second switches is connected between the second potential terminal and one of the second connecting points and the second node. The control circuit controls the first and second switches.

13 Claims, 5 Drawing Sheets

ON-RESISTANCE
OF PMOS

FIG. 6B
PRIOR ART

ON-RESISTANCE
OF NMOS

FIG. 6C
PRIOR ART

COMPOSITE
RESISTANCE

DIGITAL-TO-ANALOG CONVERTING CIRCUIT

BACKGROUND OF THE INVENTION

The present invention relates to a digital-analog converting circuit (called D/A converting circuit, hereinafter), which may be incorporated in a semiconductor integrated circuit, having voltage-dividing resistors.

Figure 4:
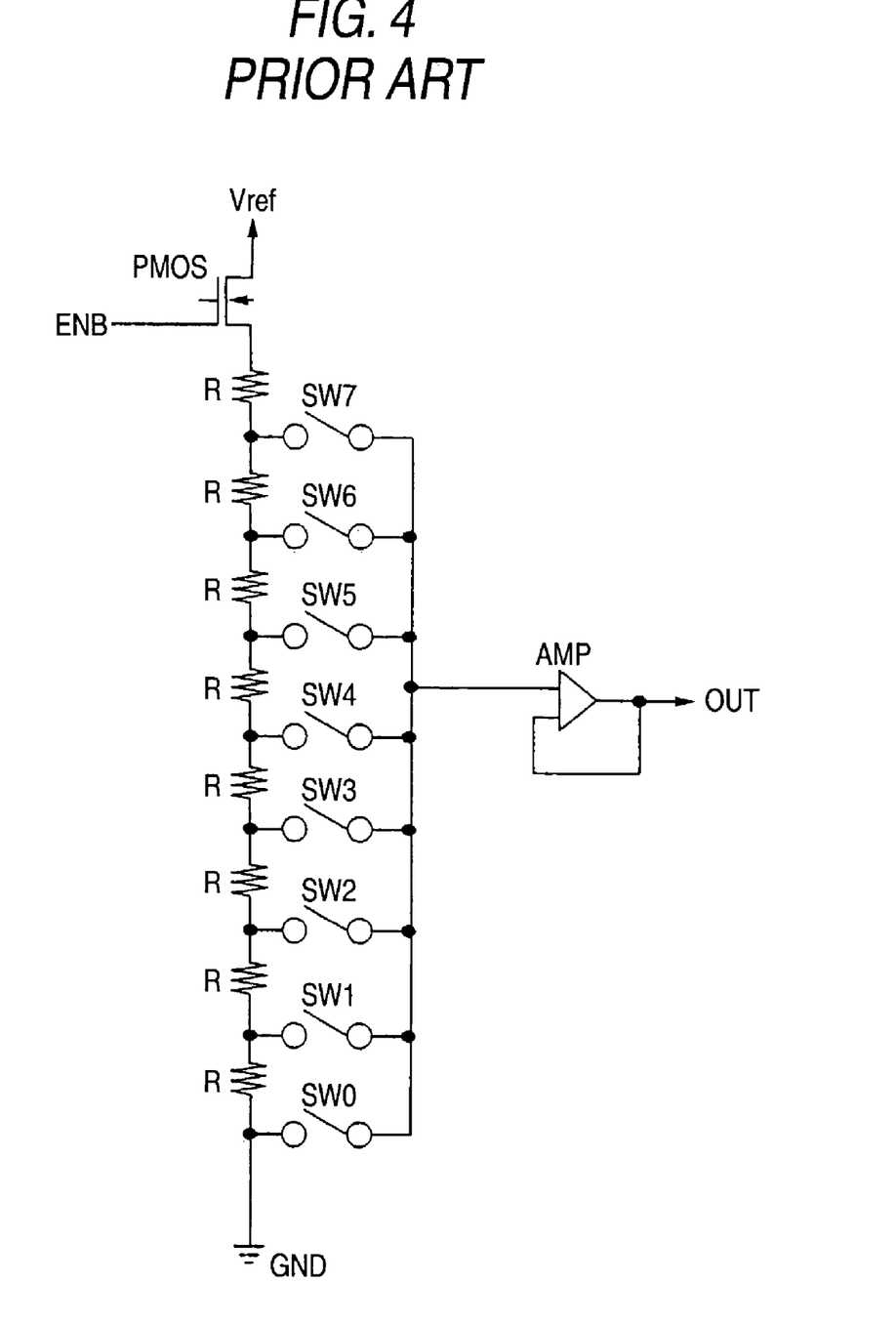
FIG. 4 is an explanatory diagram of a conventional D/A converting circuit.

FIG. 4 is an explanatory diagram schematically showing a construction of a conventional D/A converting circuit 40. The D/A converting circuit 40 is a circuit with a 3-bit resolution. Essentially, in the D/A converting circuit 40, $2^3=8$ resistors R having equal resistant values are connected in series between a reference potential terminal Vref and a ground terminal GND. The reference potential terminal Vref supplies a reference potential. The ground potential supplies a ground potential. When a digital signal (code) is input to a decoder circuit (not shown), one of switches SW0 to SW7 is selected and is turned on under the control of the decoder circuit. One of levels of nodes N0 to N7 corresponding to the ON switch is output from an output terminal OUT through an amplifier AMP. Thus, the reference potential and the ground potential are equally divided into eight so as to convert the digital signal to a desired analog signal. A PMOS transistor PMOS is connected between the reference potential terminal and the resistors R. The PMOS transistor PMOS is a switch for inhibiting an operation of the circuit and for shutting off current consumption in response to an enable signal ENB.

Figure 5:
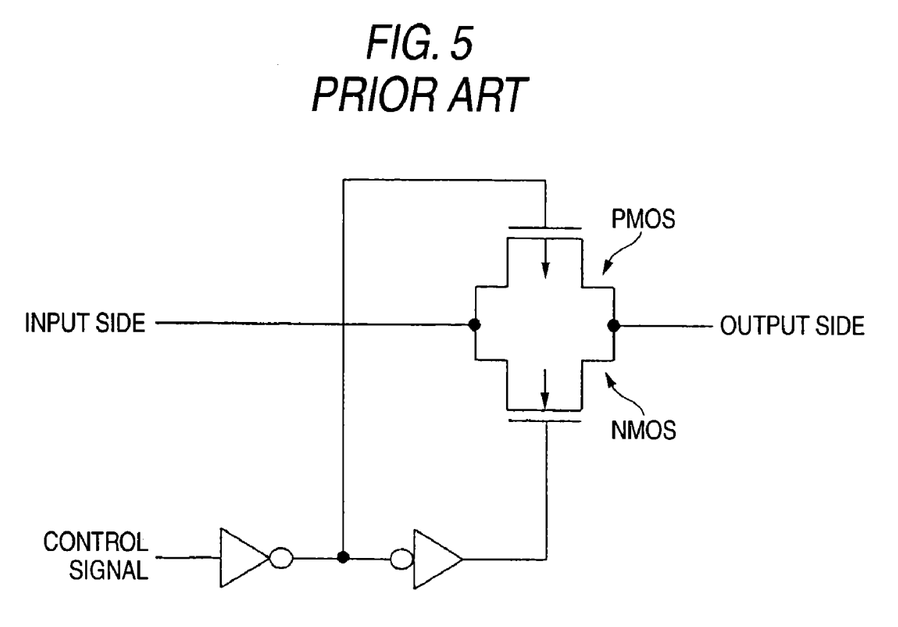
FIG. 5 is an explanatory diagram of an analog switch.
Figure 6A:
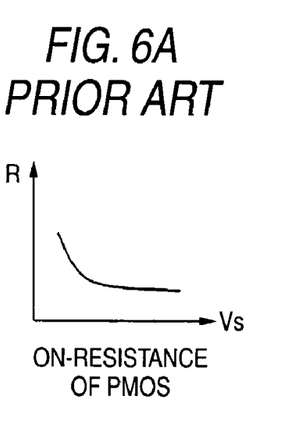
FIG. 6A shows an ON resistance of a PMOS transistor.
Figure 6B:
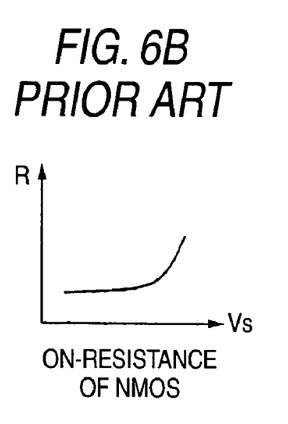
FIG. 6B shows an ON resistance of an NMOS transistor.
Figure 6C:
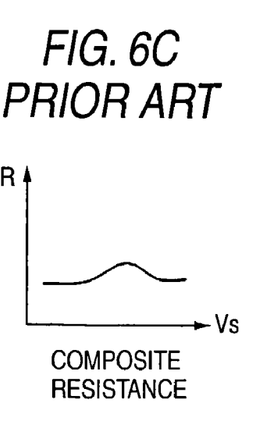
FIG. 6C shows an ON resistance of an analog switch.

Generally, as shown in FIG. 5, the switches SW0 to SW7 are implemented by analog switches. Each of the analog switches is a combination of a P-channel type MOS transistor (called PMOS transistor, hereinafter) PMOS and an N-channel type MOS transistor (called, NMOS transistor, hereinafter) NMOS. By combining the PMOS transistor and the NMOS transistor, the ON resistances of the switches can be closer to a constant value. FIGS. 6A to 6C are explanatory diagrams each showing a relationship between a potential to be applied to a MOS transistor and an ON resistance of the MOS transistor. FIG. 6A shows an ON resistance of the PMOS transistor. FIG. 6B shows an ON resistance of the NMOS transistor. FIG. 6C shows a composite resistance of the ON resistances of the PMOS transistor and NMOS transistor.

However, the conventional D/A converting circuit has problems regarding the conversion precision and the conversion speed.

As shown in FIG. 6C, the composite resistance of ON resistances of the analog switches is not completely constant and depends on the input side potential. In the conventional D/A converting circuit, the nodes N0 to N7 corresponding to the switches SW0 to SW7 have different potentials from each other. Thus, the composite resistances of the ON resistances of the switches are not constant. As a result, the D/A conversion precision can be hardly improved.

Furthermore, as described above, the analog switches have the ON resistances. Due to the ON resistances and the parasitic capacitance within the circuit, the voltage level shifting in the output side takes time. Therefore, the conversion speed can be hardly improved.

SUMMARY OF THE INVENTION

The invention may provide a novel and improved D/A converting circuit, which can improve the conversion precision and conversion speed of digital-to-analog conversion.

According to an aspect of the invention, there is provided a digital-to-analog converting circuit that includes first and second potential terminals, an output node, first and second resistors, first and second switches and a control circuit. The first resistors are connected in series between a first node and the output node through first connecting points. Each of the first switches is connected between the first potential terminal and one of the first connecting points and the first node. The second resistors are connected in series between a second node and the output node through second connecting points. Each of the second switches is connected between the second potential terminal and one of the second connecting points and the second node. The control circuit controls the first and second switches.

BRIEF DESCRIPTION OF THE DRAWINGS

FIGS. 6A to 6C are explanatory diagrams of ON resistances.

DESCRIPTION OF THE PREFERRED EMBODIMENTS

Preferred embodiments of a digital-to-analog converting circuit (D/A converting circuit) according to the invention will be described below in detail with reference to appended drawings. In this specification and the drawings, the same reference numerals are given to components having substantially the same functional constructions. The repeated description will be omitted.

This embodiment has switches between a reference potential and voltage-dividing resistors and between a ground potential and voltage-dividing resistors. Thus, a constant potential can be applied to switches. No analog switch is used as the switch.

Figure 1:
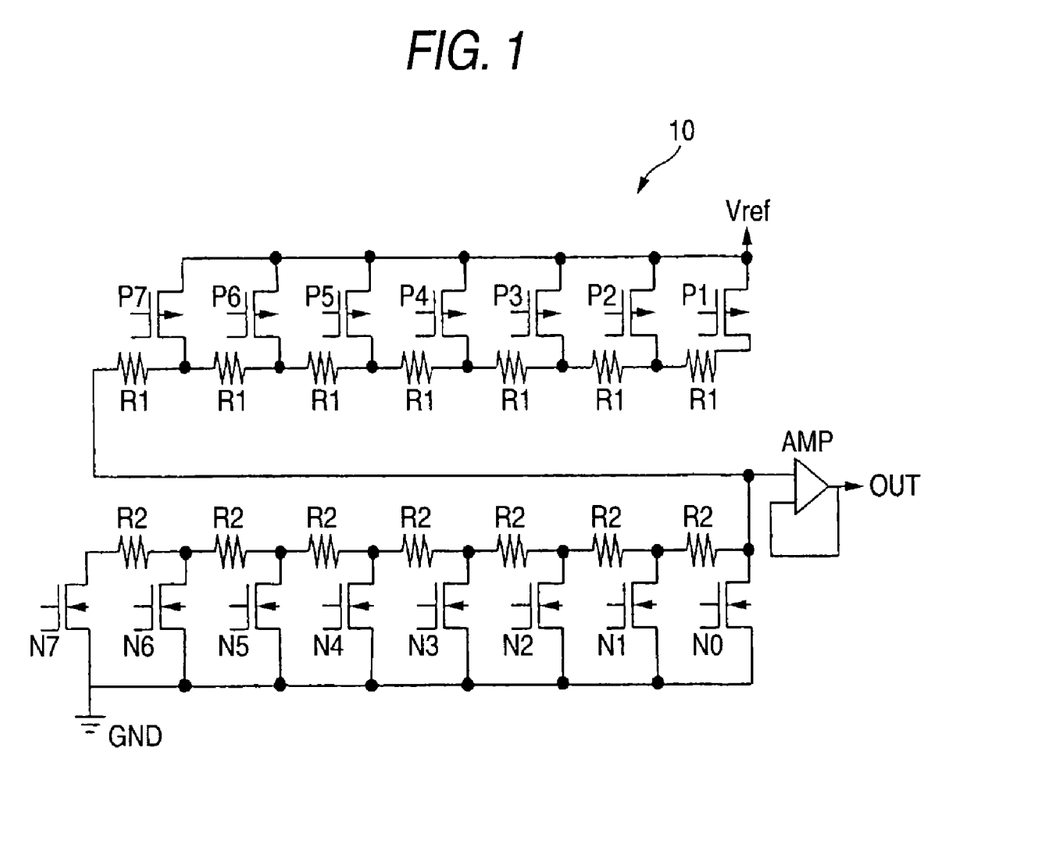
FIG. 1 is an explanatory diagram of a D/A converting circuit.

FIG. 1 is a construction diagram schematically showing a D/A converting circuit according to this embodiment. In this embodiment, a P/A converting circuit 10 has a resolution of n=3. However, the invention can be applied to a resolution of any bit.

As shown in FIG. 1, the DIA converting circuit 10 includes a reference potential terminal Vref, a ground potential terminal GND, an amplifier AMP, an output terminal OUT, $(2^n-1)=7$ reference potential side resistors R1, $(2^n-1)=7$ PMOS transistors P1 to P7, $(2^n-1)=7$ ground potential side resistors R2, and $2^n-8$ NMOS transistors N0 to N7. The reference potential terminal Vref supplies a reference potential. The ground potential terminal GND supplies a ground potential. The amplifier AMP amplifies analog signals. The output terminal OUT outputs analog signals. The reference potential side resistors RI are connected in series between the reference potential terminal Vref and the output terminal OUT. The PMOS transistors P1 to P7 correspond to the reference potential side resistors R1. The ground potential side resistors R2 are connected in series between the ground potential terminal GND and the output terminal OUT. The NMOS transistors N0 to N7 correspond to the ground potential side resistors R2.

Sources of the PMOS transistors P1 to P7 are connected to the reference potential terminal Vref. Drains of the PMOS transistors P1 to P7 are connected to the output terminal OUT through the amplifier AMP. The gates of the PMOS transistors P1 to P7 are connected to a decoder circuit 20, which will be described later. The reference potential side resistors R1 have equal resistance values.

The PMOS transistors P1 to P7 function as switches for switching paths to select between the reference potential terminal Vref and the reference potential side resistors R1 and for changing the number of the reference potential side resistors R1 from one to seven between the reference potential terminal Vref and the output terminal OUT. In other words, one of the PMOS transistors P1 to P7 is turned on so that one of the paths between the reference potential terminal Vref and the output terminal OUT can be selected. Thus, the number of the reference potential side resistors R1 between the reference potential terminal Vref and the output terminal OUT is changed from one to seven.

Ground Potential Side Resistors R2

Sources of the NMOS transistors N0 to N7 are connected to the ground potential terminal GND. Drains of the NMOS transistors N0 to N7 are connected to the output terminal OUT through the amplifier AMP. The gates of the NMOS transistors N0 to N7 are connected to the decoder circuit 20, which will be described later. The ground potential side resistors R2 have equal resistance values. The resistance values are equal to those of the reference potential side resistors R1.

The NMOS transistors N0 to N7 function as switches for switching paths between the ground potential terminal GND and the ground potential side resistors R2 and for changing the number of the ground potential side resistors R2 from zero to seven between the ground potential terminal GND and the output terminal OUT. In other words, one of the NMOS transistors N0 to N7 is turned on so that one of the paths can be selected between the ground potential terminal GND and the output terminal OUT. Thus, the number of the ground potential side resistors R2 between the ground potential terminal GND and the output terminal OUT is changed from one to seven.

Figure 2:
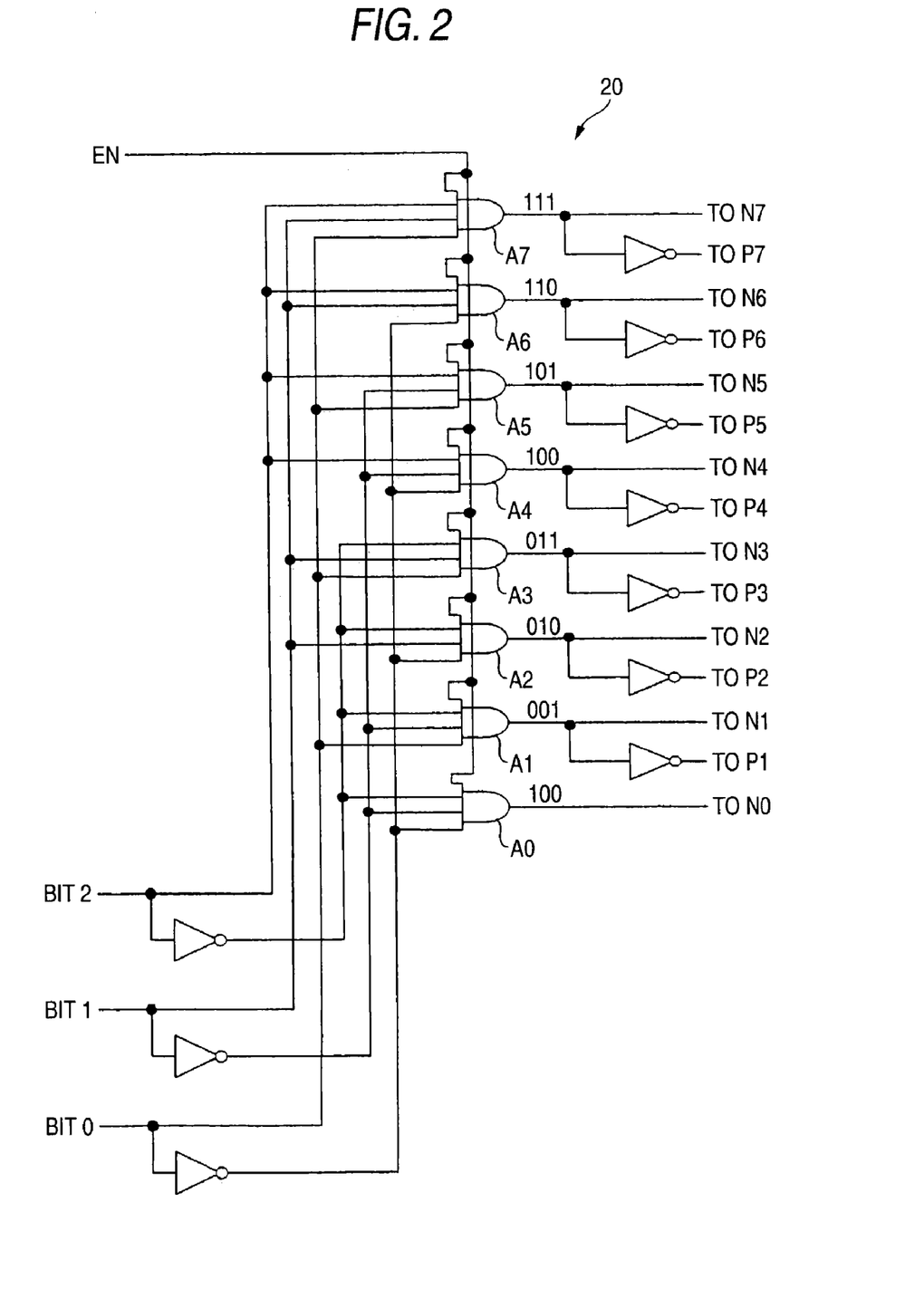
FIG. 2 is an explanatory diagram of a decoder circuit for controlling gates of MOS transistors in FIG. 1.

Next, the switching control of the PMOS transistors P1 to P7 and NMOS transistors N0 to N7 will be described. FIG. 2 is an explanatory diagram of a decoder circuit for controlling the PMOS transistors P1 to P7 and the NMOS transistors N0 to N7.

As shown in FIG. 2, the decoder circuit 20 is a logical circuit including input terminals bit 0, bit 1 and bit 2. One bit digital signal is input to each of the input terminals bit 0, bit 1 and bit 2. The output terminal is connected to the gates of the PMOS transistor P1 to P7 and the gates of the NMOS transistors N0 to N7.

An inverse signal of an input signal from the input terminal bit2, an inverse signal of an input signal from the input terminal bit 1 and an inverse signal of an input signal from the input terminal bit 0 are input to a three-input AND gate A0. The output signal of the three-input AND gate A0 is input to a gate of the NMOS transistor N0 in FIG. 1.

An inverse signal of an input signal from the input terminal bit2, an inverse signal of an input signal from the input terminal bit 1 and an input signal from the input terminal bit 0 are input to a three-input AND gate A1. An output signal of the three-input AND gate A1 is input to a gate of the NMOS transistor N1 in FIG. 1. An inverse signal of an output signal is input to the PMOS transistor P1 in FIG. 1.

An inverse signal of an input signal from the input terminal bit2, an input signal from the input terminal bit 1 and an inverse signal of an input signal from the input terminal bit 0 are input to a three-input AND gate A2. An output signal of the three-input AND gate A2 is input to a gate of the NMOS transistor N2 in FIG. 1. An inverse signal of the output signal is input to the PMOS transistor P2 in FIG. 1.

An inverse signal of an input signal from the input terminal bit2, an input signal from the input terminal bit 1 and an input signal from the input terminal bit 0 are input to a three-input AND gate A3. An output signal of the three-input AND gate A3 is input to agate of the NMOS transistor N3 in FIG. 1. An inverse signal of the output signal is input to the PMOS transistor P3 in FIG. 1.

An input signal from the input terminal bit2, an inverse signal of an input signal from the input terminal bit 1 and an inverse signal of an input signal from the input terminal bit 0 are input to a three-input AND gate A4. An output signal of the three-input AND gate A4 is input to a gate of the NMOS transistor N4 in FIG. 1. An inverse signal of the output signal is input to the PMOS transistor P4 in FIG. 1.

An input signal from the input terminal bit2, an inverse signal of an input signal from the input terminal bit 1 and an input signal from the input terminal bit 0 are input to a three-input AND gate A5. An output signal of the three-input AND gate A5 is input to a gate of the NMOS transistor N5 in FIG. 1. An inverse signal of the output signal is input to the PMOS transistor P5 in FIG. 1.

An input signal from the input terminal bit2, an input signal from the input terminal bit 1 and an inverse signal of an input signal from the input terminal bit 0 are input to a three-input AND gate A6. An output signal of the three-input AND gate A6 is input to a gate of the NMOS transistor N6 in FIG. 1. An inverse signal of the output signal is input to the PMOS transistor P6 in FIG. 1.

An input signal from the input terminal bit2, an input signal from the input terminal bit 1 and an input signal from the input terminal bit 0 are input to a three-input AND gate A7. An output signal of the three-input AND gate A7 is input to a gate of the NMOS transistor N7 in FIG. 1. An inverse signal of the output signal is input to the PMOS transistor P7 in FIG. 1.

When an enable signal EN is "0", the three-input AND gates A0 to A7 turn OFF all of the PMOS transistors P1 to P7 and NMOS transistors N0 to N7. Therefore, the operation of the D/A converting circuit 10 is inhibited, and the current consumption is shut off.

Three bit digital signals to be input to the decoder circuit 20 may be represented by (input value of the input terminal bit2, input value of the input terminal bit1, input value of the input terminal bit 0). When the three bit digital signals are (0, 0, 0) the NMOS transistor N0 is turned on in accordance with the output value of the three-input AND gate A0. The other transistors are turned off. Here, referring back to FIG. 1, the ground potential is output from the output terminal OUT.

Similarly, when the three bit digital signals are (0, 0, 1), the PMOS transistor P1 and the NMOS transistor N1 are turned on in accordance with the output value of the three-input AND gate A1. The other transistors are turned off. In this case, the reference potential x1/8 is output from the output terminal.

When the three bit digital signals are (0, 1, 0), the PMOS transistor P2 and the NMOS transistor N2 are turned on in accordance with the output value of the three-input AND gate A2. The other transistors are turned off. In this case, the reference potential x2/8 is output from the output terminal.

When the three bit digital signals are (0, 1, 1), the PMOS transistor P3 and the NMOS transistor N3 are turned on in accordance with the output value of the three-input AND gate A3. The other transistors are turned off. In this case, the reference potential x3/8 is output from the output terminal.

When the three bit digital signals are (1, 0, 0), the PMOS transistor P4 and the NMOS transistor N4 are turned on in accordance with the output value of the three-input AND gate A4. The other transistors are turned off. In this case, the reference potential x4/8 is output from the output terminal.

When the three bit digital signals are (1, 0, 1), the PMOS transistor P5 and the NMOS transistor N5 are turned on in accordance with the output value of the three-input AND gate A5. The other transistors are turned off. In this case, the reference potential x5/8 is output from the output terminal.

When the three bit digital signals are (1, 1, 0), the PMOS transistor P6 and the NMOS transistor N6 are turned on in accordance with the output value of the three-input AND gate A6. The other transistors are turned off. In this case, the reference potential x6/8 is output from the output terminal.

When the three bit digital signals are (1, 1, 1), the PMOS transistor P7 and the NMOS transistor N7 are turned on in accordance with the output value of the three-input AND gate A7. The other transistors are turned off. In this case, the reference potential x7/8 is output from the output terminal.

As described above, according to this embodiment, the PMOS transistors P1 to P7 (reference potential side switches) are used for switching paths between the reference potential terminal Vref and the reference potential side resistors R1. Therefore, all of the potentials to be applied to the PMOS transistors P1 to P7 are the reference potential and are common. Thus, the composite resistances of ON resistances are all constant in the PMOS transistors. The same is true in the NMOS transistors N0 to N7 (ground potential side switches). As a result, the precision of the D/A conversion can be improved.

The PMOS transistors P1 to P7 and the NMOS transistors N0 to N7 are used as the switches. No analog switches are used. Thus, the delay of voltage level shifting due to parasitic capacitance within the circuit can be prevented. Therefore, the conversion speed can be improved.

Furthermore, this embodiment has following advantages.

The size of each of the voltage-dividing resistors does not affect on the entire size of the D/A converting circuit 10 significantly. Therefore, increases in the numbers of the reference potential side resistors R1 and the ground potential side resistors R2 do not affect on the size of the D/A converting circuit 10 significantly.

A switch specifically for inhibiting circuit operations is not required. Therefore, an easy design is required for correcting precision errors due to ON resistances of the MOS transistors.

The decoder circuit 20 is a logical circuit. Therefore, the decoder circuit 20 is especially effective when the decoder circuit 20 is incorporated in a semiconductor integrated circuit.

All of the resistors in the circuit have an equal size. Therefore, this embodiment is suitable for a semiconductor integrated circuit, which may be different in accordance with the production.

According to a second embodiment, the construction of a decoder circuit is changed so as to be used as a D/A converting circuit having a low resolution.

Figure 3:
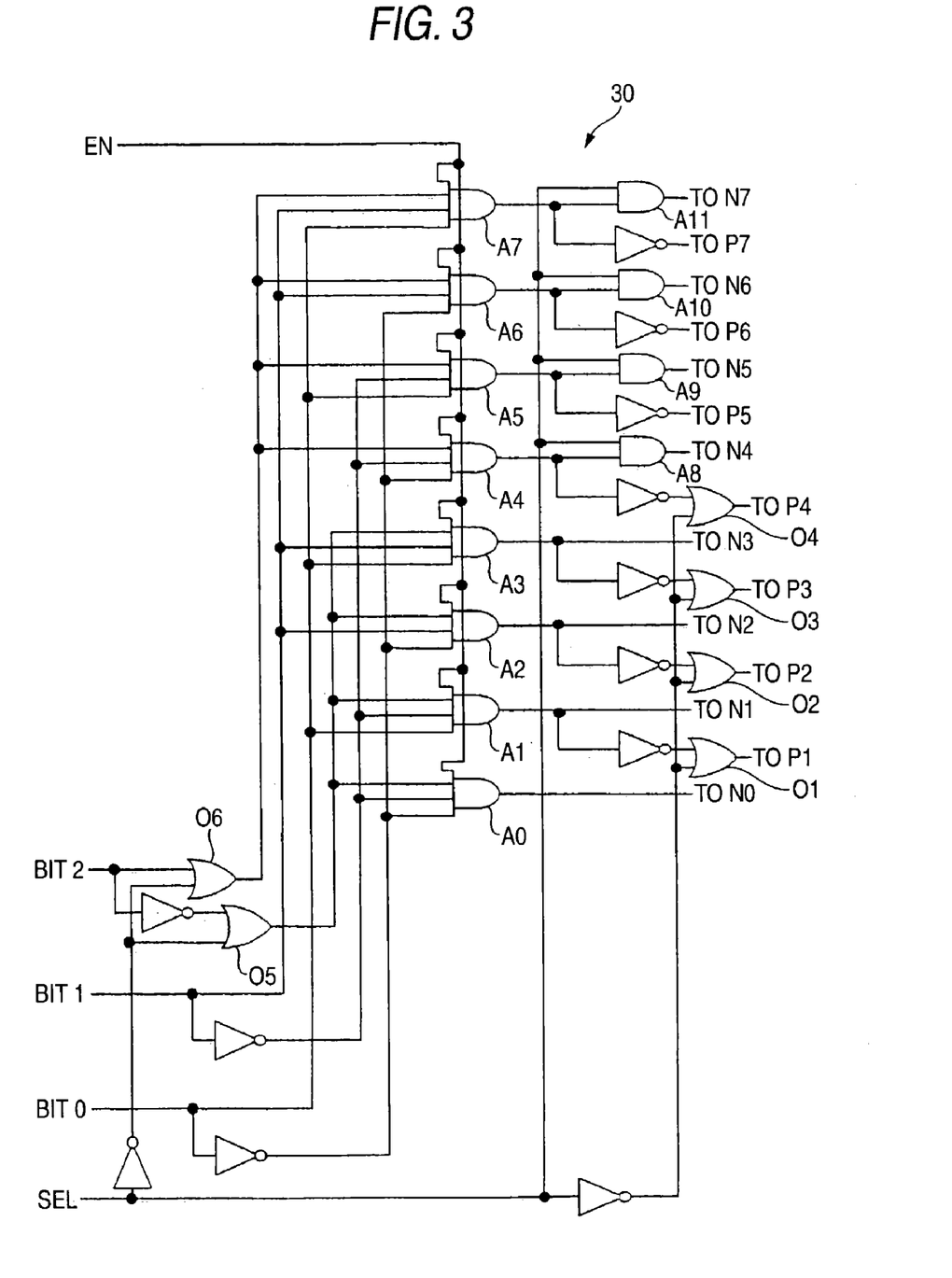
FIG. 3 is an explanatory diagram of another decoder circuit for controlling gates of the MOS transistors in FIG. 1.

FIG. 3 is an explanatory diagram schematically showing a decoder circuit in a D/A converting circuit according to this embodiment. The decoder circuit 20 shown in FIG. 2 is replaced by a decoder circuit 30. The rest of the construction is substantially the same as that of the first embodiment. Therefore, the repeated description will be omitted.

As shown in FIG. 3, the decoder circuit 30 is a logical circuit. The decoder circuit 30 includes input terminals bit0, bit1 and bit2 to each of which one bit digital signal is input. An output terminal of the decoder circuit 30 is connected to gates of the PMOS transistors P1 to P7 and gates of the NMOS transistors N0 to N7. The decoder circuit 30 is different from the decoder circuit 20 in FIG. 2 in that a select signal SEL is added for selecting an operation.

When the select signal SEL is "1", "01" is input to one input terminal of two-input OR gates O1 to O6. Thus, substantially the same operation is performed as that of the first embodiment.

When the select signal SEL is "0", "1" is input to one input terminal of the two-input OR gate O1 to O4. Thus, the PMOS transistors P1 to P4 are always' OFF. Also, "0" is input to one input terminal of the two-input AND gates A8 to A11. Thus, the NMOS transistors N4 to N7 are always OFF.

When the select signal SEL is "0", "1" is input to one input terminal of the two-input OR gates O5 and O6. Thus, the value of the input terminal bit2 does not affect on output values of the latter three-input AND gates A0 to A7. In other words, $2^2=4$ types of level are selected based on the input values of the input terminals bit0 and bit1, independently from the input value of the input terminal bit2.

Operations of Second Embodiment

Here, three bit digital signals to be input to the decoder circuit 30 are expressed by (–, input value of input terminal bit1, input value of input terminal bit0) where the input value of the input terminal bit2 of three-bit digital signals is ignored. When the three-bit digital signals are (–, 0, 0), the NMOS transistor N0 is turned on in accordance with the output value of the three-input AND gate A0. The other transistors are turned off. In this case, referring back to FIG. 1, the ground potential is output from the output terminal OUT.

Similarly, when the three bit digital signals are (–, 0, 1), the NMOS transistor N1 and the PMOS transistor P5 are turned on in accordance with the output values of the three-input AND gates A1 and A5. The other transistors are turned off. In this case, the ground potential x1/4 is output from the output terminal OUT.

When the three bit digital signals are (–, 1, 0), the NMOS transistor N2 and the PMOS transistor P6 are turned on in accordance with the output values of the three-input AND gates A2 and A6. The other transistors are turned off. In this case, the ground potential x2/4 is output from the output terminal OUT.

When the three bit digital signals are (–, 1, 1), the NMOS transistor N3 and the PMOS transistor P7 are turned on in accordance with the output values of the three-input AND gates A3 and A7. The other transistors are turned off. In this case, the ground potential x3/4 is output from the output terminal OUT.

As described above, according to this embodiment, in addition to the first embodiment, the D/A converting circuit 10 according to the first embodiment for a 3-bit resolution can be used for a two-bit resolution. When the same change is given to the input bit1 of the decoder circuit, the D/A converting circuit 10 can be used for a one-bit resolution. In other words, an arbitrary resolution can be selected and be used if the selected resolution is equal to or less than the maximum resolution, inherent to the D/A converting circuit.

The preferred embodiments of the digital-to-analog converting circuit according to the invention have been described with reference to the appended drawings. However, the invention is not limited to those embodiments. Apparently, those skilled in the art can reach to various change examples and/or modification examples within the scope of the claimed technical principle. It is understood that the change examples and modification examples are apparently included in the technical scope of the invention.

For example, each of the embodiments includes a decoder circuit (20 or 30). All of the PMOS transistors P1 to P7 provided on the reference potential terminal Vref side and the NMOS transistors N0 to N7 provided on the ground potential terminal GND side are controlled by the single decoder circuit (20 or 30). However, the invention is not limited thereto. Alternatively, a first decoder circuit and a second decoder circuit may be provided separately. The first decoder circuit controls the PMOS transistors P1 to P7 provided on the reference potential terminal Vref side. The second decoder circuit controls the NMOS transistors N0 to N7 provided on the ground potential terminal GND.

What is claimed is:

1. A digital-to-analog converting circuit comprising:
a first potential terminal for supplying a first potential;
a second potential terminal for supplying a second potential;
an output node for outputting an analog signal;
a first resistor circuit having a plurality of first resistors connected in series between a first node and the output node through a plurality of first connecting points;
a first switching circuit including P-channel type MOS transistors, each of the P-channel type MOS transistors connected directly to the first potential terminal, and to respective ones of the first connecting points and the first node, wherein only the P-channel type MOS transistors are connected to the first resistors as switches;
a second resistor circuit having a plurality of second resistors connected in series between a second node and the output node through a plurality of second connecting points;
a second switching circuit including N-channel type MOS transistors, each of the N-channel type MOS transistors connected directly to the second potential terminal, and to respective ones of the second connecting points and the second node, wherein only the N-channel type MOS transistors are connected to the second resistors as switches; and
a control circuit connected to the first and second switching circuits for controlling the P-channel type MOS transistors and the N-channel type MOS transistors,
wherein the control circuit concurrently turns off all of the p-channel type MOS transistors and all of the N-channel type MOS transistors responsive to an externally applied control signal, and
wherein the first potential is a reference potential and the second potential is a ground potential.

2. A digital-to-analog converting circuit according to claim 1, wherein the second switching circuit further has an N-channel type MOS transistor connected between the second potential terminal and the output node.

3. A digital-to-analog converting circuit according to claim 1, wherein the control circuit includes a first decoder for controlling the P-channel type MOS transistors and a second decoder for controlling the N-channel type MOS transistors.

4. A digital-to-analog converting circuit according to claim 1, further comprising an amplifier connected to the output node for amplifying the analog signal.

5. A digital-to-analog converting circuit comprising:
a first potential terminal supplying a first potential;
a second potential terminal supplying a second potential;
an output node providing an analog signal;
a plurality of first resistors connected in series between a first node and the output node, the first resistors being connected to each other at a plurality of first connecting points;
a plurality of first switches each of which is connected directly to the first potential terminal, and to respective ones of the first connecting points and the first node, wherein only P-channel type MOS transistors are connected to the first resistors as switches;
a plurality of second resistors connected in series between a second node and the output node, the second resistors being connected to each other at a plurality of second connecting points;
a plurality of second switches each of which is connected directly to the second potential terminal, and to respective ones of the second connecting points and the second node, wherein only N-channel type MOS transistors are connected to the second resistors as switches; and
a control circuit connected to control the P-channel type MOS transistors and the N-channel type MOS transistors,
the control circuit including a plurality of NAND gates that provide respective control signals to the P-channel type and N-channel type MOS transistors responsive to externally provided bit signals, and that concurrently disable all of the P-channel type and N-channel type MOS transistors responsive to an externally provided disable signal,
wherein the first potential is a reference potential and the second potential is a ground potential.

6. A digital-to-analog converting circuit according to claim 5, further comprising an additional N-channel type MOS transistor connected between the second potential terminal and the output node.

7. A digital-to-analog converting circuit according to claim 5, wherein the control circuit includes a first decoder for controlling the P-channel type MOS transistors and a second decoder for controlling the N-channel type MOS transistors.

8. A digital-to-analog converting circuit according to claim 5, further comprising an amplifier connected to the output node for amplifying the analog signal.

9. A digital-to-analog converting circuit comprising:
a first potential terminal that supplies a first potential;
a second potential terminal that supplies a second potential;
an output node that outputs an analog signal;
a first resistor circuit having a plurality of first resistors connected in series between a first node and the output node through a plurality of first connecting points;
a first switching circuit including P-channel type MOS transistors, each of the P-channel type MOS transistors connected directly to the first potential terminal, and to respective ones of the first connecting points and the first node, wherein only the P-channel type MOS transistors are connected to the first resistors as switches;

a second resistor circuit having a plurality of second resistors connected in series between a second node and the output node through a plurality of second connecting points;

a second switching circuit including N-channel type MOS transistors, each of the N-channel type MOS transistors connected directly to the second potential terminal, and to respective ones of the second connecting points and the second node, wherein only the N-channel type MOS transistors are connected to the second resistors as switches; and a control circuit connected to the first and second switching circuits that selectively turns on only one of the P-channel type MOS transistors and one of the N-channel type MOS transistors at a time to provide the analog signal at the output node, and that concurrently turns off all of the P-channel type MOS transistors and all of the N-channel type MOS transistors responsive to an externally provided disable signal.

10. A digital-to-analog converting circuit according to claim 9, wherein the second switching circuit further has an N-channel type MOS transistor connected between the second potential terminal and the output node.

11. A digital-to-analog converting circuit according to claim 9, wherein the control circuit includes a first decoder for controlling the P-channel type MOS transistors and a second decoder for controlling the N-channel type MOS transistors.

12. A digital-to-analog converting circuit according to claim 9, wherein the first potential is a reference potential and the second potential is a ground potential.

13. A digital-to-analog converting circuit according to claim 9, further comprising an amplifier connected to the output node for amplifying the analog signal.

* * * * *